US 6,737,367 B1

(12) United States Patent
Drechsler et al.

(10) Patent No.: US 6,737,367 B1
(45) Date of Patent: May 18, 2004

(54) UV-SUPPORTED THERMAL TREATMENT OF COMPOUND SEMICONDUCTORS IN RTP SYSTEMS

(75) Inventors: Martin Drechsler, Memmingen (DE); Arthur Pelzmann, Günzburg (DE)

(73) Assignee: Steag RTP Systems GmbH (DE)

( * ) Notice: Subject to any disclaimer, the term of this patent is extended or adjusted under 35 U.S.C. 154(b) by 0 days.

(21) Appl. No.: 10/069,826

(22) PCT Filed: Apr. 22, 2000

(86) PCT No.: PCT/EP00/03666
§ 371 (c)(1),
(2), (4) Date: Apr. 11, 2002

(87) PCT Pub. No.: WO00/68988
PCT Pub. Date: Nov. 16, 2000

(30) Foreign Application Priority Data

May 6, 1999 (DE) .......................... 199 20 871

(51) Int. Cl.[7] ...................... H01L 21/324; H01L 21/477
(52) U.S. Cl. ........................ 438/795; 438/796
(58) Field of Search ................. 438/29, 46, 509, 438/663, 795, 796

(56) References Cited

U.S. PATENT DOCUMENTS 5,227,328 A * 7/1993 Khan et al. ............... 438/509
5,306,662 A * 4/1994 Nakamura et al. ......... 438/509
5,496,766 A * 3/1996 Amano et al. ............. 438/29
5,786,233 A   7/1998 Taskar et al.

FOREIGN PATENT DOCUMENTS

EP   0 399 662        11/1990
EP   0723 303 A2      7/1996

OTHER PUBLICATIONS

Y. Kamiura et al., "Photo–Enhanced Activation of Hydrogen–Passivated Magnesium in P–Type GaN Films," Jpn. J. Appl. Phys. vol. 37, Pt. B, pp. L970–L971, Aug. 1998.

* cited by examiner

Primary Examiner—Erik J. Kielin
Assistant Examiner—Stephen W. Smoot
(74) Attorney, Agent, or Firm—R W Becker & Associates; R W Becker

(57) ABSTRACT

A method of formally treating at least one layer for activating foreign atoms passivated in the layer by hydrogen is provided. The at least one layer is heated, in a first time interval of less than 120 seconds, above a first temperature at which a specific sheet resistance of the at least one layer decreases. The at least one layer is heated, in a second time interval which is within the first time interval and is less than 60 seconds, to above a decomposition temperature of the layer. Charge carriers are produced in the at least one layer during at least one third time interval, by electromagnetic radiation, wherein the energy of such electromagnetic radiation is greater than an energy gap of the at least one layer.

19 Claims, 2 Drawing Sheets

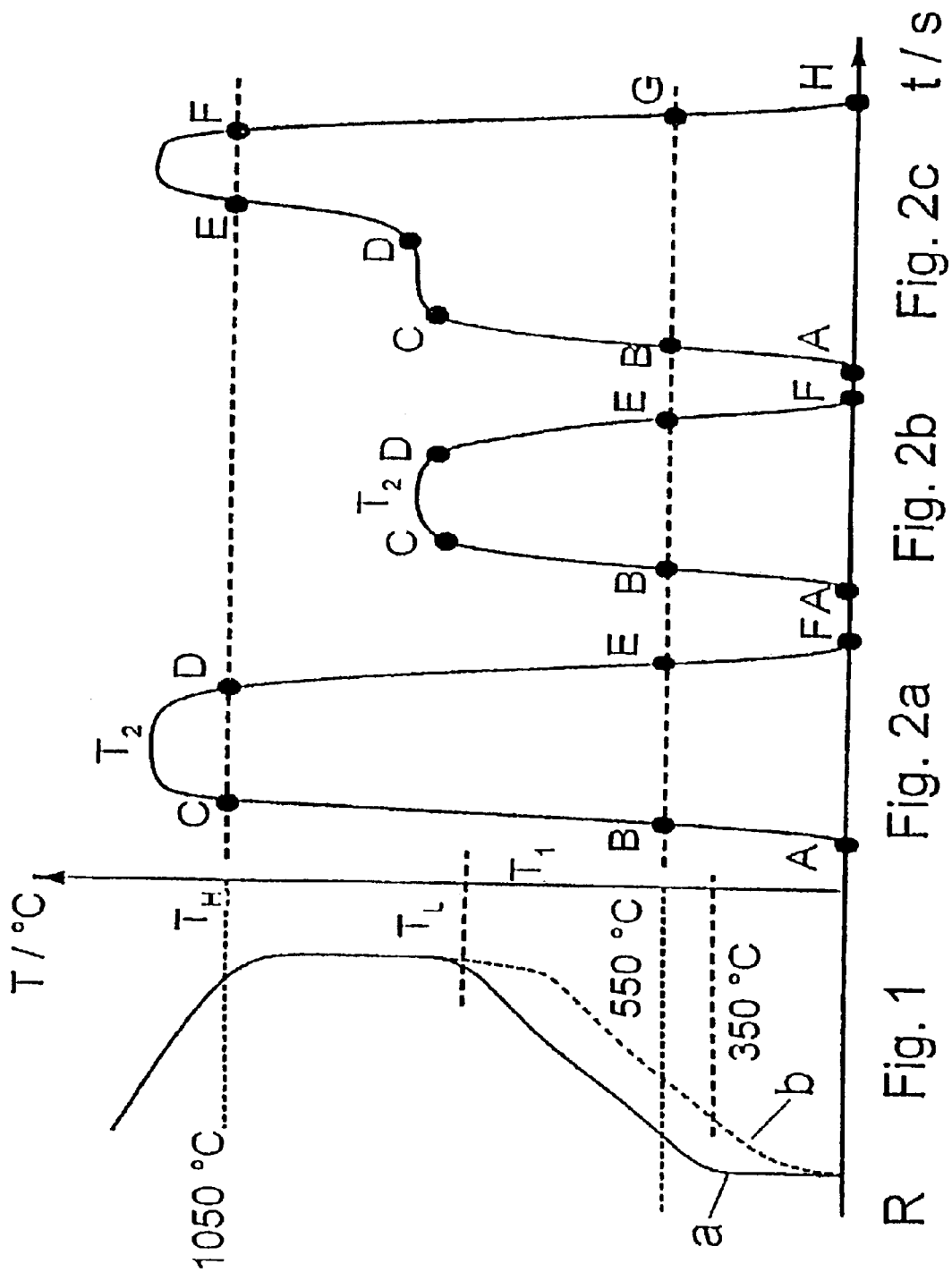

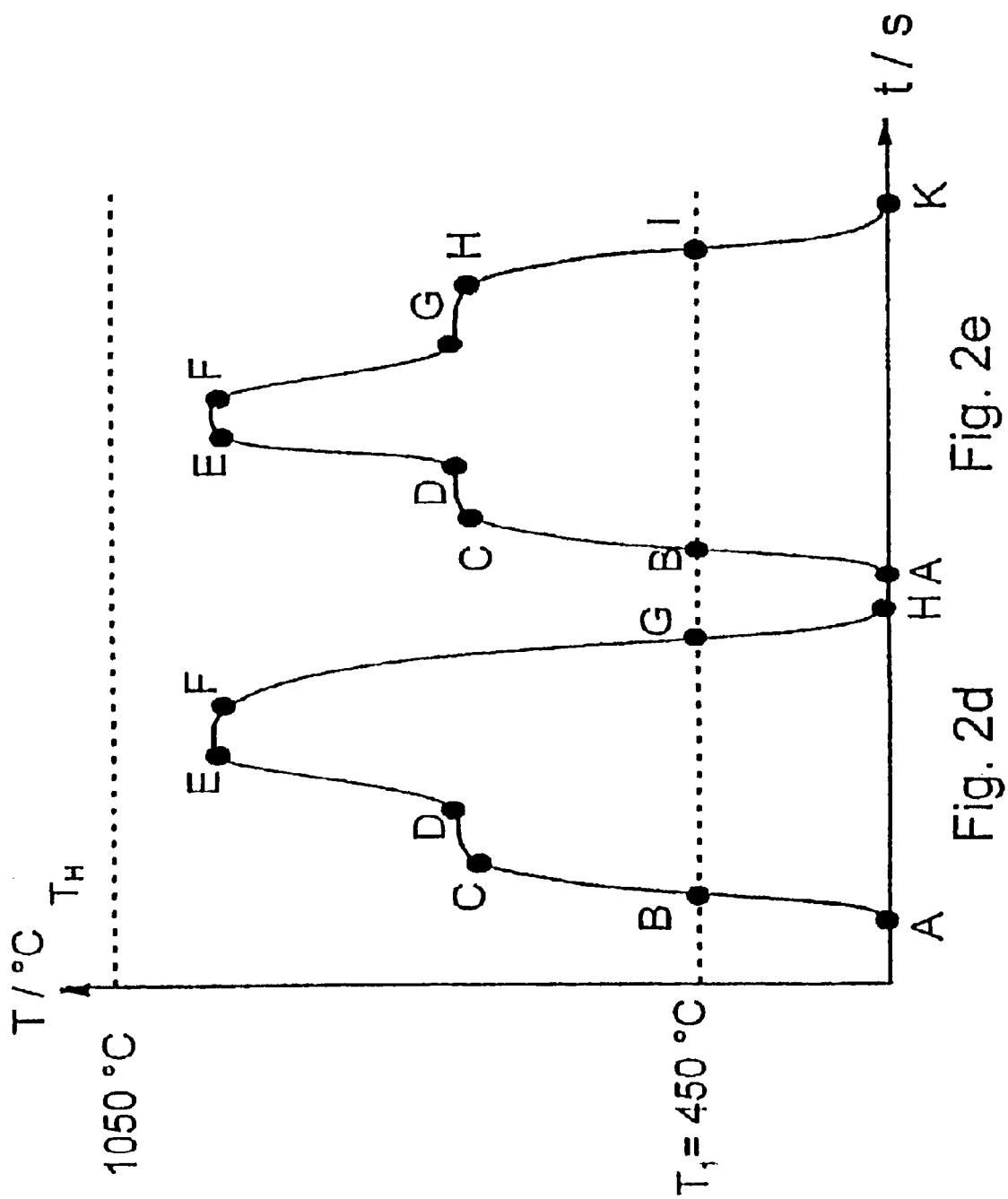

UV-SUPPORTED THERMAL TREATMENT OF COMPOUND SEMICONDUCTORS IN RTP SYSTEMS

BACKGROUND OF THE INVENTION

The present invention relates to a method of thermally treating at least one layer, preferably comprising compound semiconductors, for activating foreign or impurity atoms passivated in the layer by hydrogen, according to which at least one layer is heated for a first time interval of less than 120 seconds to a temperature greater than a first temperature at which the specific layer or sheet resistance decreases.

The described method is used for the electrical activation of the p-doping of II-VI and III-V semiconductors that are produced by CVD (Chemical Vapor Deposition), especially by MOCVD (Metal Organic Chemical Vapor Deposition), processes. Such semiconductors are used, for example, for the manufacture of opto-electronic components (e.g. light emitting components such as blue light diodes or laser diodes). During the CVD processes, in addition to the acceptor hydrogen is also incorporated into the semiconductor layer during the p-doping (e.g. in III-V semiconductors Mg, C, Zn, Be, Cd, Ca, Ba, or in II-VI semiconductors N). Along with the acceptor atoms, the hydrogen form an electrically inactive complex, which leads to a passivation of the acceptor atoms (e.g. Mg) and hence to a high sheet resistance. A number of methods are known for activating the passivated acceptor atoms, according to which the electrically inactive hydrogen-acceptor complex (or in general hydrogen-foreign atom complex) are broken up and the hydrogen is removed from the p-doped or implanted layer by diffusion.

A method according to the initially described type for activating the hydrogen acceptor complexes is described in U.S. Pat. No. 5,786,233, whereby during the method the substrate is irradiated with short wave light, the photon energy of which is greater than the energy gap or band gap at the process temperature. The substrates are preferably heated to temperatures of approximately 650° C. to 800° C. for a duration of two to thirty minutes. In so doing, the complexes are broken up and the previously passivated acceptors (e.g. GaN:Mg) are activated, as a result of which the sheet resistance is reduced by up to several orders of magnitude, and the hole carrier concentration is correspondingly increased, respectively. As a result of the irradiation with short wavelength light, the activation of the acceptors and hence the hole carrier concentration were significantly increased. Since at still higher temperatures, however, the layer is thermally damaged and the p-diffusivity again decreases as the treatment duration increases, pursuant to U.S. Pat. No. 5,786,233 a longer annealing is preferably used at comparatively low temperatures.

Yoichi Kamiura et al.; Jpn.J.Appl.Phys. 37 (1998) L970–L971 describes the influence of UV irradiation upon the Mg activation of GaN films. In this connection, the GaN films are held in a furnace for about one hour at a temperature greater than an activation temperature of about 550° C. Upon irradiation of the Mg doped GaN layer with UV radiation, the activation temperature can be reduced approximately by 100° C., as a result of which the thermal stress of the substrates is similarly reduced.

In EP 0723303, there is described a light-emitting electronic component that is built up of a hetero structure, and a method for producing the same, according to which at approximately 600° C. with the aid of UV laser radiation, an annealing is carried out in order to increase the acceptor activation in the layers and to reduce the sheet resistance, respectively.

In Mamoru Miyachi et al.; Appl.Phys.Lett., Volume 72, No 9, 1101 (1998), there is described the thermal activation of Mg in GaN with the additional generation of charge carriers that are generated by applying a potential to the semiconductor structure. In addition, reference is made to the fact that a p-type or conducting characteristic of GaN that contains Mg is also achieved and can be influenced by an irradiation with low energy electrons.

All of the previously described methods serve for the activation of the hydrogen-passivated acceptors. The drawback of the above described methods is that relatively long process times are necessary for the activation, whereby in general the substrates (e.g. Sapphire, SiC, Si, AlN, ZnO or $Al_2O_3$), with the semiconductor films disposed thereon, are subjected to a high thermal stress, and in addition the throughput is very low.

SUMMARY OF THE INVENTION

It is an object of the present invention to eliminate these drawbacks.

Pursuant to the present invention, this object is realized in that with the initially described method, within the first time interval at least one layer is heated for a second time interval of up to 60 seconds to a second temperature that is greater than the first temperature, whereby during the method in at least one third time interval charge carriers are produced within the layer by electromagnetic radiation.

By means of the inventive method, the process duration is advantageously considerably shortened for the activation of the hydrogen-passivated foreign atoms (e.g. Mg) in one or more layers (e.g. GaN) that are comprised of compound semiconductors, whereby sheet resistance and hole carrier concentration are comparable with the aforementioned known methods.

The inventive method is preferably carried out in rapid heating or RTP (Rapid Thermal Processing) systems, since in RTP systems the semiconductor can be processed with very precise temperature-time processes and very high uniformity.

The first temperature of the inventive method is selected between 350° C. and 900° C., whereby for example with Mg-containing GaN (or in general with group III nitrides) a temperature between 350° C. and 600° C. is preferred. Depending upon the type of semiconductor, the first temperature can also be a function of the selection of the third time interval and of the intensity of the electromagnetic radiation and of the generation of minority charge carriers connected therewith. As the length of the third time interval increases, and with increasing Intensity of the electromagnetic radiation, then depending upon the type of semiconductor the first temperature can be decreased, which advantageously leads to a reduction of the thermal stress of the layer.

The second temperature during the second time interval is preferably selected between 700° C. and 1400° C. The selection of this temperature depends to a considerable extent upon the material of the compound semiconductor, whereby for example with Mg-containing GaN a second temperature between 850° C. and 1200° C. is preferably selected. By selecting a higher second temperature, the second time interval can preferably be considerably shortened, which similarly again leads to a reduction of the thermal stressing of the semiconductor layer or of the semiconductor layer system.

Heating the semiconductor to a second temperature that is greater than the decomposition temperature can be effected for a short period of time. If the surface of the semiconductor layer is provided with a coating (e.g. $SiO_2$), or if the semiconductor layer is heated at an overpressure, for example in a hydrogen-free $N_2$ atmosphere, a decomposition of the compound semiconductor takes place only at higher temperatures, as a result of which the second temperature can be further increased. In this connection, time and temperature are selected in such a way that, for example in the case of Mg-doped GaN, the donor centers that result from nitrogen vacancies do not exceed the number of active Mg centers (in general active activator centers), so that in particular a p-type or conducting characteristic of the layer results. As a consequence, there is provided the possibility of setting or establishing the concentration and activation of donor and acceptor centers in wide ranges.

The duration of the third time interval, during which charge carriers are produced within the semiconductor layers by electromagnetic radiation, can be the same as the duration of the first time interval. In this connection, during the overall process portion of the method during which the semiconductor layer has a temperature greater than the first temperature, minority charge carriers are generated.

The third time interval can, however, also be disposed entirely or partially outside of the first time interval. The layer is then irradiated also or only during the heating and/or cooling phase, or another desired temperature-time process step, which is disposed prior to or after the first time interval, within which the layer temperature is still below the first temperature. This is in particular advantageous if a repassivation of activated foreign atom (e.g. Mg) by hydrogen is to be avoided during the cooling, or if as described above the first temperature is already to be achieved earlier, i.e. at a lower temperature.

On the whole, as a result of the position and the length of the second and third time intervals, as well as a result of the first and second temperature, also the spatial concentration profile of the activated and passivated foreign atoms can be set or established. If the second temperature is above the decomposition temperature, the defect concentration and the spatial distribution thereof can also be set or established. Thus, for example, the third time interval can encompass the second, can be the same or within the second time interval, can be disposed prior to the second time interval, can encompass time ranges prior to and beyond the second time interval or time ranges from the second and after the second time interval, or can also encompass time intervals after the second time interval.

The layers can include group III-V and/or group II-VI compound semiconductors, especially group III nitrides such as, for example, GaN.

The energy of the electromagnetic radiation of the inventive method is advantageously greater than the energy gap of at least one layer. As a result, minority carriers are produced within the layer by the electromagnetic radiation, thereby facilitating the activation of the hydrogen-passivated foreign atoms, avoiding a repassivation of the foreign atoms, and supporting the diffusion of the hydrogen.

The inventive method is advantageously carried out, as mentioned above, by means of a rapid heating system (RTP System), since by means of the RTP system defined very short heating processes can be carried out in the range of one second up to 30 minutes. The temperature-time curves of the substrates can be established precisely to the second in a temperature range of room temperature to about 1400° C., whereby the substrate can be heated extremely uniformly not only at low temperatures but also at high temperatures. Similarly, in RTP systems various process gases, which surround the substrate, can also be used, whereby the process gas pressure can be adjusted from vacuum conditions to overpressure conditions.

BRIEF DESCRIPTION OF THE DRAWINGS

The present invention will be described in detail in the following with reference to the following figures. The drawings show:

FIG. 1 schematically the sheet resistance as a function of the temperature and the influence of electromagnetic radiation thereupon, FIG. 2a–2e various schematically illustrated temperature-time curves for a semiconductor layer treated in an RTP system.

DESCRIPTION OF PREFERRED EMBODIMENTS

In FIG. 1, curve a, schematically shows a typical plot of a sheet resistance of a compound semiconductor, e.g. a GaN film that is treated or doped with Mg, as a function of the temperature. At low temperatures (e.g. GaN at less than approximately 550° C.), the semiconductor film has a high electrical resistance R due to the passivation of the foreign atoms (e.g. Mg) by hydrogen. As the temperature increases, the resistance is reduced since more and more hydrogen-acceptor (foreign atom) complexes break up and the acceptors are thus electrically activated. If all of the complexes are broken up, and all acceptors activated, as the temperature increases from a lower temperature value $T_L$ to an upper temperature value $T_H$, the sheet resistance remains nearly constant. Above the upper temperature value $T_H$ the sheet resistance R again significantly increases as the temperature increases, since above this temperature $T_H$ a decomposition of the semiconductor layer occurs. For Mg doped GaN, at atmospheric pressure, $T_L$ is approximately 550° C. and $T_H$ is approximately 1050° C.

By generating minority charge carriers, the temperature $T_L$ can be reduced. In this connection, the charge carriers can be generated, for example, by irradiation with UV light, whereby the irradiated photon energy is greater that the energy gap of the semiconductor layer at the appropriate layer temperature. However, the charge carriers can also be generated, for example, by applying a potential or voltage to a semiconductor layer or to a semiconductor layer system, or by a combination of UV irradiation and applying a potential or a voltage to the layer or the layer system. The reduction of the lower temperature value $T_L$ depends upon the number of charge carriers generated. The lower temperature value can be lowered by approximately 100° C. by means of UV irradiation, for example in the case of GaN with a wavelength of less than approximately 360 nm as illustrated in FIG. 1 by the curve b.

FIG. 2a shows an example of a temperature-time curve of the inventive method. The semiconductor layer or in general the semiconductor layer system is heated from room temperature (point A) as rapidly as possible to the temperature $T_1$, at which the sheet resistance of the semiconductor, or the sheet resistance of at least one layer of the semiconductor system, decreases (point B). Now for a first time interval of less than 120 seconds (time difference BE between B and E), the temperature of the layer (or at least one layer of the layer system) is held above the temperature T. Within this first time interval, the layer is heated for the duration of a second time interval (time difference CD between point D and C) to a second temperature $T_2$, whereby the second time interval is less than 60 seconds. Within this second time interval, the temperature-time curve can in general have any curve with fluctuations of up to 200° C. about the second temperature $T_2$. FIG. 2a shows for GaN a $T_1$ of about 550° C. and a $T_2$ greater than the decomposition temperature of about 1050° C., for which reason the second time interval CD is less than 60 seconds, preferably less than 30 seconds. The lower threshold value for the second time interval is in general determined by the (closed loop) control rate with which the increasing portion of the temperature-time curve (ramp up) can be changed into the decreasing portion (ramp down). For modern RTP systems, this time is approximately 1 second. Under certain conditions, this value can be lowered with future improvements of the RTP systems. The duration of the second time interval CD (in FIG. 2a) decidedly determines how much the temperature $T_2$ can exceed the decomposition temperature $T_H$ without permanently damaging the semiconductor layer or the layer system. The shorter the second time interval CD, the greater can be the temperature $T_2$, since then the overall thermal stressing of the layer does not exceed a critical value in the time interval CD. If the thermal stress is below this critical value, then depending upon the type of semiconductor, the vacancies and defects that are formed can to the greatest extent or at least in part be again eliminated by a subsequent annealing (tempering) at a temperature less than $T_H$. The critical value of the thermal stress of the layer or of the layer system is to be determined experimentally. So that as high a temperature $T_2$ as possible can be achieved at prescribed critical thermal stress, it is important that the RTP system enable a rapid heating up or cooling off of the semiconductor. Typical maximum heating rates are, depending upon the unit, between 75° C/s and 500° C/s. During the process illustrated in FIG. 2a, charge carriers are generated within the layer for the duration of at least one third time Interval by electromagnetic radiation, preferably by UV radiation. In this connection, the third time interval can be equal to the first time interval BE, as a result of which the free charge carriers are produced only if the Mg-(or in general foreign atom) hydrogen complexes are already nearly thermally broken up. Due to the (photo) generated free electrons, the diffusion characteristic of the broken-up hydrogen within the semiconductor layer can then be influenced. Alternatively, the third time interval can also embrace the second BE or the overall process AF. In general, the third time interval can be anywhere within the process AF, whereby its duration can be up to the overall process time AF. The lower limit of the third time, interval is limited by the technical possibilities of providing an adequate UV light capacity. At the present this limit is approximately $10^{-9}$s for pulsed lasers and approximately $10^{-5}$s for flash lamps. However, time intervals of 1 to 120 seconds are preferred. It is particularly advantageous to set the third time interval during the cooling-off phase such that during the cooling of the layer, a repassivation of the foreign atoms (e.g. the Mg in GaN) is extensively prevented. Furthermore, it is also advantageous during the heating-up phase, for example in the range AB or AC, to produce charge carriers by UV irradiation, as a result of which, as illustrated in FIG. 1, the first temperature $T_1$, and hence also the thermal stress of the semiconductor, can be reduced. Furthermore, within the process AF, charge carriers can be produced by UV radiation in a plurality of (third) time intervals. For example, the aforementioned advantages can be combined by producing charge carriers between AB or AC in ramp up and in ramp down.

FIG. 2b shows a further example of the inventive method, according to which the temperature $T_2$ is below the decomposition temperature $T_H$. Here also at least one semiconductor layer is heated for at least one time interval BE of less than 120s to a temperature greater than the first temperature $T_1$ and for a second time interval CD of less than 60s is held at a temperature $T_2$. The length of the second time interval CD is here less critical since the second temperature $T_2$ is below the decomposition temperature $T_H$. The position and the duration of the third time interval can be selected in conformity with the foregoing discussion in conjunction with FIG. 2a. The position and duration of the third time interval is optimized as a function of the influence of the diffusion of the hydrogen, which results during the consumption of the Mg (foreign atom) hydrogen complex, by the free charge carriers generated by the UV radiation. This is to be determined experimentally and depends upon the semiconductor layer. Thus, for example, it can be advantageous, during the process range AB (in FIG. 2b), to irradiate the layer with UV light. As a result, the Mg-H complex is already broken up at low temperatures. During the process range BD, the hydrogen diffuses at very high diffusion constants into the surface regions of the layer. During the cooling-off phase DF, a renewed UV irradiation is effected in order to prevent a repassivation of the Mg (the foreign atoms) in GaN (in II-VI or III-V semiconductors). On the whole, with this method one obtains a high degree of activation.

A further embodiment is illustrated in FIG. 2c. In contrast to the previous examples, the semiconductor layer is tempered in the temperature range between $T_1$ and $T_H$ for a time interval CD of less than 120s. During this time, the activation of the foreign atoms is effected by breaking up the hydrogen-foreign atom complex and the hydrogen or the hydrogen ions diffused in the direction of the semiconductor surface, respectively. As a result of the further temperature increase DEF the hydrogen diffusion is increased. In this connection, the temperature can exceed the decomposition temperature $T_H$, as illustrated in FIG. 2c, or can be below this temperature as shown in FIG. 2d. Here also, the rate of activation or repassivation (or the spatial distributions thereof) can be influenced by the position and duration of the third time interval and by irradiation with UV light. In the examples of FIGS. 2c and FIG. 2d, not only the time interval CD but also the time interval EF with the respectively pertaining (average) temperature can be seen as the second time interval and the second temperature $T_2$, respectively. Due to the diffusion and activation mechanism, the time interval EF of the higher temperature is preferably considerably shorter than the time interval CD. The intervals are together shorter than 120s, which is the maximum permissible time for the first time interval BG.

A further specific embodiment of the present invention is illustrated in FIG. 2e. In contrast to FIG. 2c and FIG. 2d, here a further temperature step in the interval GH follows a high temperature EF, which is preceded by a lower temperature step CD (approximately as in FIG. 2c). This step GH is particularly advantageous if appreciable defect formation (e.g. N-vacancies in GaN) occurs due to a high temperature step EF (which can also be disposed above the decomposition temperature). Depending upon the semiconductor material, these defects can extensively or at least partially be cured in the step GH. Also in this example, not only the time interval CD but also the time intervals EF and/or GH can be interpreted as the second time interval or as second time intervals, whereby the interval length is then less than 60s. The sum of the intervals CD, EF and GH are similarly less that 120s, which is the maximum permissible time for the first time interval B1. With regard to the position and duration of the third time interval, within which charge carriers are produced in the semiconductor layer by electromagnetic radiation (e.g. UV light), in a manner analogous to the preceding specific examples, the rate of activation or repassivation (and the distributions thereof, respectively) can be influenced by irradiation with UV light. For this purpose, the position and the duration of the third time interval is suitably selected within the process AK, whereby as described above, the semiconductor layer is preferably irradiated with UV light in the range of the heating up, in other words for example in the range AB or AC, and in the ranges of the cooling off, in other words for example in the ranges FG and/or H1.

By applying an electrical field to the semiconductor layer, the diffusion process of the hydrogen resulting during the activation can also be influenced, i.e. the diffusion through the semiconductor layer can be accelerated. This can be effected, for example, in that the substrate with the semiconductor layer and the semiconductor layer system, respectively, is provided with a positive potential with respect to the process gas, or with respect to an electrode that is spaced over the layer. Such an arrangement, or such a method, can be used by itself or in combination with the previously illustrated method. In general, in the third time interval, in addition to the electromagnetic radiation, a potential can be used in the described type and manner, or during the third time interval only a potential can be utilized for all of the aforementioned cases, i.e., a UV irradiation is dispensed with. If during the third time interval only a potential or a field is applied to the layer, this does not necessarily produce charge carriers in the layer. Already the change of the electrochemical potential alters the diffusion of the hydrogen in the layer.

The specification incorporates by reference the disclosure of German priority document 199 20 871.9 filed 06 May 1999 and International Application PCT/EP00/03666 filed 22 Apr. 2000.

The present invention is, of course, in no way restricted to the specific disclosure of the specification and drawings, but also encompasses any modifications within the scope of the appended claims.

What is claimed is:

1. A method of thermally treating at least one layer for activating foreign atoms passivated in the layer by hydrogen, said method including the steps of:

heating said at least one layer, in a first time interval of less than 120 seconds, above a first temperature at which a specific sheet resistance of said at least one layer decreases;

heating said at least one layer, in a second time interval which is within said first time interval and is less than 60 seconds, to a second temperature above a decomposition temperature of said layer; and producing charge carriers in said at least one layer during at least one third time interval, by electromagnetic radiation, wherein the energy of said electromagnetic radiation is greater than an energy gap of said at least one layer.

2. A method according to claim 1, wherein said first temperature is between 300° C. and 1200° C.

3. A method according to claim 2, wherein said second temperature is between 600° and 1200° C.

4. A method according to claim 1, wherein thermal method steps are carried out beyond said first time interval at temperatures less than said first temperature.

5. A method according to claim 1, wherein said third time interval is partially beyond said first time interval.

6. A method according to claim 1, wherein said third time interval is equal to said first time interval.

7. A method according to claim 1, wherein said third time interval is beyond said first time interval.

8. A method according to claim 1, wherein said third time interval encompasses said second time interval.

9. A method according to claim 1, wherein said charge carriers are produced prior to said second time interval in terms of time.

10. A method according to claim 1, wherein said charge carriers are produced prior to and during said second time interval in terms of time.

11. A method according claim 1, wherein said charge carriers are produced during and after said second time interval.

12. A method according to claim 1, wherein said charge carriers are produced after said second time interval.

13. A method according to claim 1, wherein said charge carriers are produced only prior to and after said second time interval.

14. A method according to claim 1, wherein said charge carriers are produced within said second time interval.

15. A method according to claim 1, wherein said at least one layer includes compound semiconductors of the group III–V.

16. A method according to claim 1, wherein said at least one layer includes compound semiconductors of the group II–VI.

17. A method according to claim 1, wherein said at least one layer includes compound semiconductors of the group III nitrides.

18. A method according to claim 1, wherein said thermal treatment of a layer is effected within an RTP system.

19. A method according to claim 1, wherein said second time interval is less than 30 seconds.

* * * * *